(12) United States Patent
Jeffrey

(10) Patent No.: US 6,353,298 B1
(45) Date of Patent: Mar. 5, 2002

(54) LOW DISTORTION AUDIO RANGE CLASS-AB FULL H-BRIDGE PRE-DRIVER AMPLIFIER

(75) Inventor: Edward N. Jeffrey, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/681,459

(22) Filed: Apr. 11, 2001

(51) Int. Cl.⁷ .............................. G11B 5/48; H03F 3/26
(52) U.S. Cl. ...................... 318/293; 360/75; 369/44.36; 330/146; 330/274
(58) Field of Search .................. 318/280, 287, 318/291, 293, 294, 560, 619; 360/75; 369/43, 44.35, 44.36; 330/262, 269, 273, 274, 146

(56) References Cited

U.S. PATENT DOCUMENTS

| | | | |
|---|---|---|---|
| 5,191,297 A | * 3/1993 | Penman et al. ............. 330/146 |
| 5,297,024 A | 3/1994 | Carobolante |
| 5,384,524 A | 1/1995 | Romano |
| 5,631,527 A | * 5/1997 | Canclini .................... 318/254 |
| 5,644,484 A | * 7/1997 | Elango ........................ 363/98 |
| 5,838,515 A | 11/1998 | Mortazavi et al. |
| 6,151,186 A | 11/2000 | O'Farrell |
| 6,229,273 B1 | * 5/2001 | Kelly et al. ................. 318/254 |

OTHER PUBLICATIONS

Gray et al., "Analysis and Design of Analog Integrated Circuits Third Edition" John Wiley & Sons, Inc, pp. 378–382, 1993.
"An All NPN AB Biased Power Output Stage", IBM TDB, pp. 2825–2826, 12/77.
Reduced Current Sense Offset Errors in a Motor Power Driver, IBM TDB, pp. 320–321, 10/89.
"Position Control Motor Driver with Dead–Band Avoidance Circuit", IBM TDB, pp. 119–120, 10/95.

* cited by examiner

Primary Examiner—Bentsu Ro
(74) Attorney, Agent, or Firm—W. Daniel Swayze, Jr.; W. James Brady; Frederick J. Telecky, Jr.

(57) ABSTRACT

A circuit (40) and method for applying drive voltages to a voice coil motor (VCM) (22) of a mass data storage device (10) has two driver sets, each having a high side driver (HSD) (42,46) and a low side driver (LSD) (44,48) connected to the VCM (22). Each driver set has two SENSEFETs (50,52), each having a power FET and a sense FET. A circuit (106,104) is provided for sensing a sense current in the sense FET of the LSD, and a circuit (60,76,74) is provided for increasing the bias on the gates of the SENSEFET (52) in the LSD when the sense current falls below a predetermined level (VREF). Also, a circuit (113, 114,110) is provided for driving a predetermined current in the SENSEFET of the HSD when the sense current falls below the predetermined level. Thus, a current at the predetermined level always flows in the SENSEFETs (50,52).

22 Claims, 3 Drawing Sheets

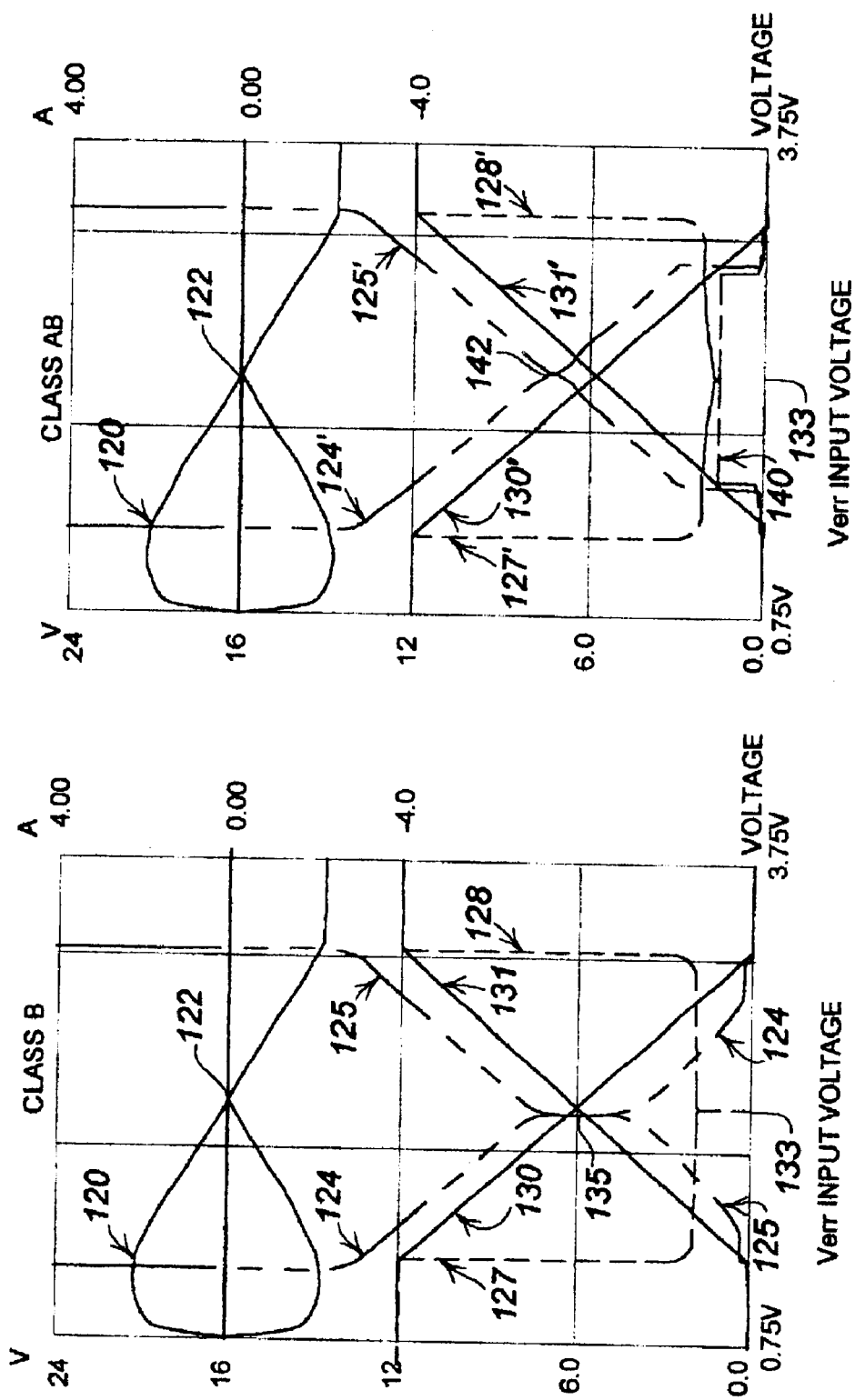

LOW DISTORTION AUDIO RANGE CLASS-AB FULL H-BRIDGE PRE-DRIVER AMPLIFIER

BACKGROUND OF INVENTION

1. Field of Invention

This invention relates to improvements in power amplifier methods and apparatuses that are suitable for use in both audio devices and devices for dynamic information storage or retrieval. More particularly, this invention in one aspect relates to improvements in methods and circuitry for controlling the position of the data transducer, or head, used in mass data storage devices, hard disk drive devices, or the like.

2. Relevant Background

Mass data storage devices include tape drives, as well as hard disk drives that have one or more spinning magnetic disks or platters onto which data is recorded for storage and subsequent retrieval. Hard disk drives may be used in many applications, including personal computers, set top boxes, video and television applications, audio applications, or some mix thereof. Many applications are still being developed. Applications for hard disk drives are increasing in number, and are expected to further increase in the future. Mass data storage devices may also include optical disks in which the optical properties of a spinning disk are locally varied to provide a reflectivity gradient that can be detected by a laser transducer head, or the like. Optical disks may be used, for example, to contain data, music, or other information.

The data transducer or head used in mass data storage devices is selectively positioned to desired locations of the disk by a voice coil motor (VCM). The circuitry that provides drive signals to the VCM typically has a pair of high and low side driver circuits. In operation, each set of high and low side drivers is connected on respective opposite sides of the VCM, and operate in a manner in which a high side driver from one set is activated together with a low side driver of the other set to drive a current through the VCM in one direction to move the head in a respective first direction. When the respective high and low side drivers of the opposite sides are activated, a current is driven in the opposite direction through the VCM to move the head in the opposite direction.

Very low distortion is required in power amplifiers used specifically in hard disk drive servo systems as well as audio systems. When a full NMOS H-bridge operates a voice coil at or around the null, or "dead band" or "dead zone" area, significant distortion can result. This distortion normally occurs because the H-bridge driver FETs turn off in this zone of operation. In the past, a Class-AB mode of operation has been imposed onto the H-bridge transistors by brute force techniques. For example, one way that has been used is to switchably apply a gate voltage onto the H-bridge transistors during crossover from a high side driver to a low side driver, or vice versa. This technique is generally uncontrollable, and often does not result in the desired harmonic distortion or other desired switchover characteristics.

What is needed therefore, is a means for controlling the operation of the power FETs of an audio amplifier of the type used in mass data storage devices, or the like, so that at switchover between the high and low side drivers, a Class-AB mode of operation can be controllably maintained.

SUMMARY OF INVENTION

In light of the above, therefore, it is an object of the invention to provide a Class-AB driver circuit for a VCM of a mass data storage device in which better control and predictability of the Class-AB quiescent current can be achieved.

It is another object of the invention to provide a Class-AB driver circuit of the type described in which predictable power consumption and crossover linearity of the VCM current can be achieved.

It is still another object of the invention to provide a Class-AB driver circuit of the type described that has lower harmonic switchover distortion.

One advantage of the invention is that Class-AB operation of a power amplifier can be maintained and controlled during switchover, without the occurrence of discontinuities thereat.

It is another advantage of the invention that the total harmonic distortion of the circuit can be greatly reduced due to the elimination of any discontinuities at the Class-AB switchover point.

It is another advantage of the invention that the power dissipation of the circuit during switchover is greatly reduced from previous circuits.

Another advantage of the invention is that it can be practiced with either external or integrated H-bridge transistors, without a strict requirement for parameter matching therebetween.

Yet another advantage of the invention is that it enables Class-AB operation to be maintained as the high and low side H-bridge transistors are switched through the "dead zone", which results in less distortion and fewer harmonics.

It is yet another advantage of the invention to provide a method and circuit in which a wider Class-AB range of operation can be achieved, which results in lower distortion at higher operating frequencies.

It is still yet another advantage of the invention to provide a method and circuit in which a more precise quiescent current due to separate control of the quiescent current of each power FET, which results in higher power efficiency, as well as lower distortion.

These and other objects, features, and advantages of the invention will be apparent to those skilled in the art from the following detailed description of the invention, when read in conjunction with the accompanying drawings and appended claims.

According to a broad aspect of the invention, a circuit is provided for applying drive voltages to a voice coil motor (VCM), such as that of a mass data storage device, or the like. The circuit has two driver sets. Each driver set has a high side driver and a low side driver. Each driver set is connected to respective opposite sides of the VCM. Each driver set has first and second SENSEFET devices respectively in the high side driver and the low side driver. Each SENSEFET device has a first portion for selectively connecting a side of the VCM to a VCM driving potential and a second portion for sensing a current in the first portion. The first and second portions may be, for example, a power FET portion and a sense FET portion. A circuit is provided for sensing a sense current in the second portion of the SENSEFET device of the low side driver, and a circuit is provided for increasing the bias on the gate of the SENSEFET device in the low side driver when the sense current falls below a predetermined level. In addition, a circuit is provided for driving a predetermined current in the SENSEFET device of the high side driver when the sense current falls below the predetermined level. Thus a current of at least about the predetermined level always flows in the SENSEFET devices.

According to another broad aspect of the invention, a circuit is presented for maintaining a Class-AB mode of operation of an H-bridge voice coil motor (VCM) driver. The circuit has four SENSEFET devices connected in an H-bridge configuration with the VCM. Four gate biasing circuits are connected to bias respective gates of the SENSEFET devices to selectively turn the SENSEFET devices on and off in response to positioning signals for the VCM. Sensing circuitry is associated with respective the SENSEFET devices to operate the gate biasing circuits to maintain gate biases on the SENSEFET devices when currents in the SENSEFET devices fall below a predetermined level to maintain the circuit in Class-AB mode of operation.

According to yet another broad aspect of the invention, a circuit is provided for applying drive voltages to a voice coil motor (VCM), such as that of a mass data storage device, or the like. The circuit has two driver sets, each including a high and a low side driver. Each driver set is connected to respective opposite sides of the VCM. Each driver set has first and second SENSEFETs respectively in the high and low side drivers. Each SENSEFET has a power FET portion for selectively connecting a side of the VCM to a driving voltage potential and a sense FET portion for sensing a sense current in the power FET portion. Means are provided for developing a sense voltage proportional to the sense current sensed by the sense FET portion of the SENSEFET of the low side driver. Means are also provided for increasing a gate bias on gates of the SENSEFET of the low side driver when the sense current falls below a predetermined level. Means are additionally provided for driving a predetermined current in the power FET portion of the SENSEFET of the high side driver when the sense current falls below the predetermined level. Thus, at least about the predetermined current flows in the SENSEFETs at least during a switchover from a high side driver to a low side driver in one of the driver sets.

According to yet another broad aspect of the invention, a method is presented for providing drive voltages to a voice coil motor (VCM). The method includes configuring four SENSEFET devices in an H-bridge configuration with the VCM to provide two driver sets with each driver set including a high side driver and a low side driver. The method also includes biasing the SENSEFET devices to conduct a minimum quiescent current during a switchover between a high side driver and a low side driver in one of the driver sets.

According to yet another broad aspect of the invention, a mass data storage device is presented. The mass data storage device includes a circuit for providing drive voltages to a voice coil motor (VCM) and has two driver sets. Each driver set has a high and a low side driver for connection to respective opposite sides of the VCM. Each of the driver set includes first and second SENSEFET devices respectively in the high and low side drivers. Each SENSEFET device has a first portion for selectively connecting a side of the VCM to a VCM driving potential and a second portion for sensing a current in the first portion. A circuit is provided for developing a sense voltage proportional to a sense current sensed by the second portion of the SENSEFET device of the low side driver, and a circuit is provided for increasing a gate bias on gates of the SENSEFET device of the low side driver when the sense current falls below a predetermined level. A circuit is also provided for driving a predetermined current in the SENSEFET device of the high side driver when the sense current falls below the predetermined level. Thus, a current of at least about the predetermined level always flows in the SENSEFET devices.

BRIEF DESCRIPTION OF DRAWINGS

The invention is illustrated in the accompanying drawings, in which:

FIG. 3 shows curves of VCM current vs. input voltage and voltage of the various driver gates vs. input voltage of Class-B switching transistors in a circuit constructed in accordance with the prior art.

FIG. 4 shows curves of VCM current vs. input voltage and voltage of the various driver gates vs. input voltage of Class-AB switching transistors in a circuit constructed in accordance with a preferred embodiment of the invention.

In the various figures of the drawing, like reference numerals are used to denote like or similar parts.

DETAILED DESCRIPTION

This invention describes the Class-AB design of a predriver Integrated Circuit that can drive a special discrete off chip FETs configured as a full H-bridge with almost no distortion. This invention can also be used just as effectively with on-chip FET drivers. According to the invention a Class-AB technique can be achieved that keeps the driver FETs conducting nearly eliminating distortion in this "dead band" area.

An integrated circuit predriver that has to drive an external full H-bridge with four unmatched discrete NMOS transistors in a Class-AB mode is difficult to implement. This is because an accuracy reference is needed for each discrete transistor to generate its Class-AB quiescent current. Because each driver is discrete and electrically unmatched this invention uses special sense FETs build as part of the driver, ratioed to match electrically. The predriver is designed to regulate the quiescent current of each power FET according to the reference current of the sense FET.

Briefly, the Class-AB circuit controls separately the quiescent current of each of four H-bridge drivers. The quiescent current of the two low side drivers are controlled by sensing the current in the sense FETs of the driver devices. The low side sense FET is built into the sense FETs of its associated driver and is ratioed to be a fraction of the size of the drivers. The current is sensed via a resistor. The sense voltage is compared to a low voltage reference by way of a differential transconductance amplifier. The output of the transconductance amplifier controls the current in the predriver during the normally off time of the H-bridge, forcing the gate voltage higher keeping the driver from turning off.

On the high side, the quiescent current of the high side drivers is controlled by a constant current source that is applied to the source output of the high side sense FETs. The source voltage is then compared to the phase voltage output of the VCM via a differential transconductance amplifier. The transconductance amplifier regulates the high side gate voltage so that the source voltage of the sense FETs is nearly the same as the phase voltage. This keeps the quiescent current in the high side FET flowing when the driver is in the normally "off" operating region.

Therefore, during the normally off region, quiescent current in both low sides as well as high side driver transistors will flow. All four FETs are be biased "on" eliminating crossover distortion. A unique feature is that the quiescent current of the low side drivers is active over a very wide range of the H-bridge. In standard Class-AB circuits the quiescent current stops flowing past a narrow range on either side of the "dead zone". Using the circuit and method of the present invention, the low side transistor conducts further from the null region. This results in a smoother transition and lower distortion, as the voice coil current changes polarity, especially at higher frequencies.

Figure 1:
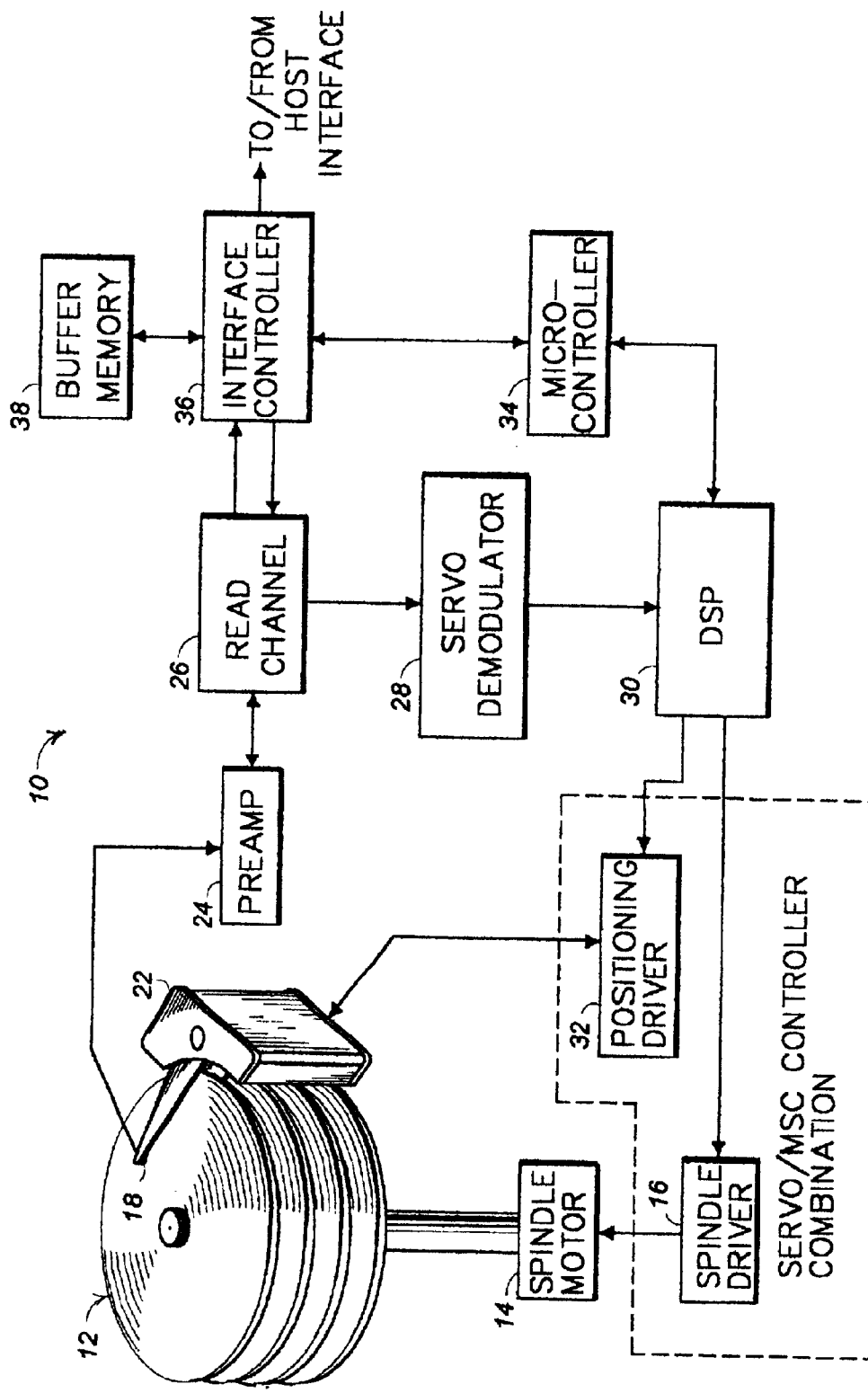
FIG. 1 is a block diagram of a generic disk drive system, illustrating the general environment in which the invention may be practiced.

A preferred embodiment of the invention is illustrated in the accompanying drawings, to which reference is now made. A block diagram of a generic disk drive system 10, which represents the general environment in which the invention may be practiced is shown in FIG. 1. The system 10 includes a magnetic media disk 12 that is rotated by a spindle motor 14 and spindle driver circuit 16. A data transducer or head 18 is locatable along selectable radial tracks (not shown) of the disk 12 by a voice coil motor 22. The radial tracks may contain magnetic states that contain information about the tracks, such as track identification data, location information, synchronization data, as well as user data, and so forth. The head 18 is used both to record user data to and read user data back from the disk, as well as to detect signals that identify the tracks and sectors at which data is written, and to detect servo bursts that enable the head to be properly laterally aligned with the tracks of the disk.

Analog electrical signals that are generated by the head 18 in response to the magnetic signals recorded on the disk are preamplified by a preamplifier 24 for delivery to read channel circuitry 26. Servo signals that are prerecorded on the disk 12 are detected and demodulated by one or more servo demodulator circuits 28 and processed by a digital signal processor (DSP) 30 to control the position of the head 18 via the positioning driver circuit 32. The servo data that is read and processed may be analog data that is interpreted by the DSP 30 for positioning the head 18.

A microcontroller 34 is typically provided to control the DSP 30, as well as an interface controller 36 to enable data to be passed to and from a host interface (not shown) in known manner. A data memory 38 may be provided, if desired, to buffer data being written to and read from the disk 12.

Figure 2:
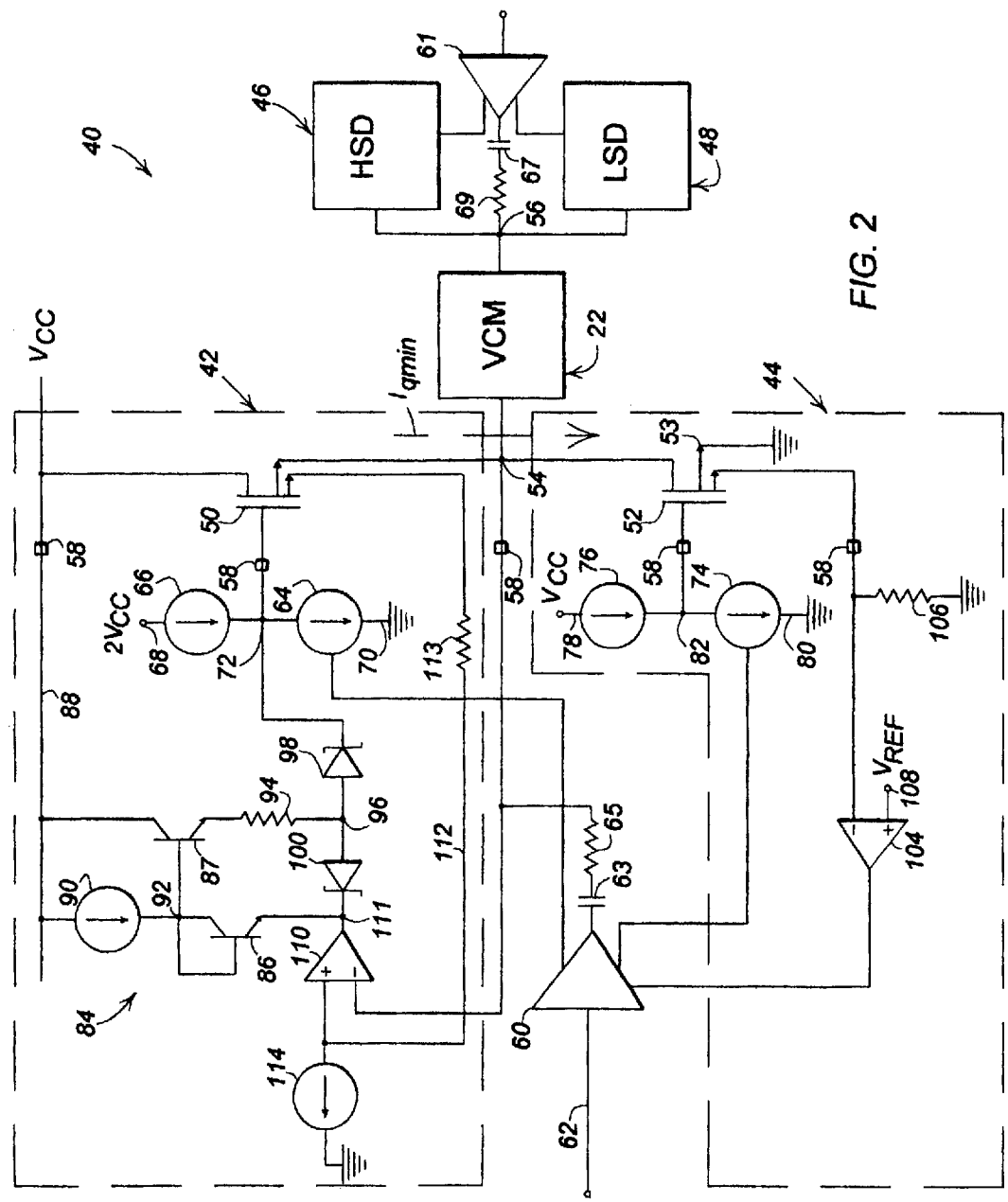
FIG. 2 is a schematic and block diagram of a portion of a VCM driver circuit, according to a preferred embodiment of the invention, which may be included in the positioning driver block of FIG. 1.

With reference now additionally to FIG. 2, a VCM driver circuit 40 is shown. The VCM driver circuit 40, which is a portion of the positioning driver circuit 32 of FIG. 1, includes two driver sets. Each driver set has a high side driver and a low side driver connected to respective opposite sides of the VCM 22. Thus, the driver set drawn on the left side of the VCM 22 includes a high side driver 42 and a low side driver 44. The driver set drawn on the right side of the VCM 22 includes a high side driver 46 and a low side driver 48. Only details of the high and low side driver circuits 42 and 44 are shown; however, it will be understood that the circuits of the corresponding high and low side drivers 46 and 48 are substantially the same.

With respect to the circuit details of the high and low side drivers 42 and 44, the high side driver 42 has a power FET device 50 to selectively pull up the side of the VCM 22 to which it is connected to a supply voltage, $V_{CC}$ 88. Similarly, the low side driver circuit 44 has a power FET device 52 connected to selectively pull down the side of the VCM 22 to which it is connected to ground 53. (The power FET devices 50 and 52 are variously referred to herein as power FET devices, H-bridge driver transistors, or SENSEFET devices.) Both are connected to a common VCM node 54.

The corresponding common VCM node 56 on the opposite side of the VCM 22 is similarly pulled up or down by the respective high or low side driver circuits 46 or 48. In operation, to energize the VCM 22, a high side driver on one side of the VCM 22 and a low side driver on the opposite side of the VCM are selected. A current path is then established from $V_{CC}$ to ground through the selected high side driver, the VCM, and the selected low side driver.

In the embodiment illustrated, the power transistor devices 50 and 52 preferably are configured as "SENSEFET" devices. A SENSEFET device is a power device having a second source terminal that is used to sense the current flowing within the device between its first source and its drain element. Essentially, SENSEFET devices have two transistors with gates and drains interconnected, with separate drain elements for output. One transistor is generally used as the power transistor, and the other transistor, referred to as the sense or mirror transistor, is used to sense the current flowing in the power transistor. A suitable ratio of power transistor to sense transistor sized for the circuit illustrated may be, for example, 200:1.

SENSEFET devices are well known, and suitable devices for the SENSEFET devices 50 and 52 are sold by ON Semiconductor Corporation of Phoenix, Ariz., as part number PMDF6302. The SENSEFET devices 50 and 52 are typically external devices, as shown, that are connected to the remaining circuitry of the high and low side driver set with which they are associated, which is typically integrated onto a single semiconductor chip as a part of the driver circuitry. The pins interconnecting the internal and external devices are denoted by the reference numeral 58.

The SENSEFET devices 50 and 52 are switched to control the position of the head 18 by a control voltage, $V_{err}$, applied to the input terminal 62 of an amplifier 60 in the manner described below. A similar amplifier 61 is provided to the high and low side driver set on the opposite side of the VCM 22. An output of the amplifier 60 is connected by a capacitor 63 and resistor 65 connected to the input node 54 on the left side of the VCM 22. Similarly, an output of the amplifier 61 is connected by a capacitor 67 and resistor 69 to the node 56 on the right side of the VCM 22.

In response to the control voltage, $V_{err}$, the amplifier 60 produces a first output to control a variable current source 64 on the high side, which, in conjunction with current source 66 forms a current path between a supply voltage 68 and a reference potential, such as ground 70. In the circuit illustrated, the supply voltage 68 is twice $V_{CC}$. The node 72 to which the current sources 66 and 64 are connected is connected to the gate of the SENSEFET device 50, as shown. When the current in the lower current source 70 is less than the current supplied by the upper current source 66, the gate of the SENSEFET 50 is charged to turn it on. On the other hand, when the current in the lower current source 70 is greater than the current supplied by the upper current source 66, the current source 70 sinks current from the gate of the SENSEFET 50 to turn it off.

Similarly, a second output of the amplifier 60 is connected to control the current in a variable current source 74 in the low side driver 44. The lower variable current source 74 is connected in series with an upper current source 76 between a supply source 78 and a reference potential, or ground 80, as shown. In the circuit illustrated, the supply voltage 78 is $V_{CC}$. The upper and lower current sources 76 and 74 is connected to a node 82, which is connected to the gate of SENSEFET 52, as shown. When the current in the lower current source 74 is less than the current supplied by the upper current source 76, the gate of the SENSEFET 52 is charged to turn it on. On the other hand, when the current in the lower current source 74 is greater than the current supplied by the upper current source 76, the current source 74 sinks current from the gate of the SENSEFET 52 to turn it off. The outputs of the amplifier 60 are out-of-phase, so when the lower variable current source 70 of the high side driver 42 is turning off, the lower variable current source 74 of the low side driver 44 is turning on, and vice versa.

A gate charging circuit 84 is connected between the supply rail 88 and the gate of the FET power device 50 to provide a charging current thereto to decrease the switching time of the device 50. The charging circuit 84 include two NPN devices 86 and 87, and a current source 90. The current source 90 and NPN transistor 86 are connected in series, with the NPN transistor 86 diode connected to develop a reference voltage on node 92 for application to the base of the NPN transistor 87. The emitter of the transistor 87 is connected by a resistor 94 to a node 96 that allows current to flow through diode 98 to the gate of the SENSEFET 50. A second diode 100 is provided to prevent current from flowing in the reverse direction. It is noted that since the voltage on node 92 is referenced to the node 111 at the output of amplifier 110, below described, the voltage on node 111 is translated to the node 96 for application to the gate of the SENSEFET 50.

To ensure that the circuit 40 operates in Class-AB mode during switchover between the high and low side drivers 50 and 52, the low side driver 44 is provided with a transconductance amplifier 104, which receives on one of its input terminals an input from the source of the sense or mirror transistor of the low side SENSEFET 52. A resistor 1 06 is connected between the source of the sense transistor and a reference potential, or ground, as shown, across which a voltage is developed for comparison to a reference voltage $V_{REF}$ 108 on a second input of the transconductance amplifier 104. The output from the transconductance amplifier 104 is connected to control the gain of the input amplifier 60. The voltage developed across the resistor 106 is proportional to the current flowing in the SENSEFET 52. Thus, as the voltage across the resistor 60 falls as the SENSEFET 52 is turning off, before the SENSEFET reaches the "dead zone" where no current flows, the voltage across the transconductance amplifier 104 turns it on to sink current from the amplifier 60. The amplifier 104 sinks current from the current source 74, causing the voltage on the gate of SENSEFET 52 to go up, to keep it conducting in Class-AB mode during the switchover. However, during normal operation outside of the "dead zone", or switchover region, the voltage from the sensing FET portion of the SENSEFET 52 is less than the reference voltage on input terminal 108, and the output from the transconductance is zero. In this mode, the transconductance amplifier 104 does not affect the outputs of the input amplifier 60.

On the other hand, the high side driver 42 contains a transconductance amplifier 110, which receives as one input the voltage from the source of the sense transistor of the SENSEFET 50 on line 112, and as its second input, the voltage on node 54 that is connected to the VCM 22. A current source 114 is connected from the line 112 to ground. A resistor 113 is connected in series between the second FET source and the inputs to the transconductance amplifier 110. As a result, the current that is provided by the current source 114 pulls a current of that value, $I_{qmin}$, through the SENSEFET 50, for example, when the transistor 50 would otherwise be shut off. The current flows through the resistor 113 to develop a voltage thereacross that is applied to the first input to the transconductance amplifier 110. Thus, as voltage on the node 54 approaches zero, a current nevertheless will flow in the circuit between the source elements of the SENSEFETs 50 and 52.

It should be noted that the H-bridge transistors 50 and 52 may be external devices to the integrated circuit on which the remainder of the circuitry is formed. Nevertheless, because of the separate operations of the Class-AB circuits of the high and low side drivers, if the quiescent current of the two H-bridge transistors is not exactly the same, the currents will still be in a small current range, and significant distortion will not be produced. Thus, exact matching of the H-bridge transistors is not a strict requirement of the circuit.

A graph of the voltages of various components in the circuit of FIG. 2 during switchover in Class-AB operation is shown in FIG. 4, and a corresponding graph of the voltages of various components in the circuit of FIG. 2 during switchover in Class-B operation is shown in FIG. 3, for comparison. With reference first to FIG. 3, the current in the VCM is represented in the curves by curve 120, which is zero at the crossover or switching point 122. The voltage on the gates of the SENSEFETs of the high side drivers is denoted by curves 124 and 125, and the voltage on the gates of the SENSEFETs of the low side drivers is denoted by the curves 127 and 128. It can be seen that as the voltage on each side of the VCM changes, shown by curves 130 and 131, the voltage on the gates of the SENSEFETs of the low side drivers in Class-B mode of operation drops to zero at the switchover point 133. Similarly, the voltage on the gates of the SENSEFETs of the high side drivers in Class-B mode of operation has a region at which the substantially similar voltage values 135. This is the "dead zone", which causes many of the undesirable circuit characteristics addressed by the circuit of the invention.

In contrast, with reference additionally to FIG. 4, in Class-AB mode of operation realized by the circuit of the invention, as the voltage on each side of the VCM changes, shown by curves 130' and 131', the voltage on the gates of the SENSEFETs of the low side drivers does not drop to zero at the switchover point 133. Instead, the voltage maintains a substantially constant voltage value .140 established by the servo operation of the transconductance amplifier 104 described above. Similarly, the voltage on the gates of the SENSEFETs of the high side drivers, shown by curves 124' and 125' has a sharp crossover region 142. Consequently, the "dead zone" of operation previously seen in the Class-B mode of operation of the driver circuit has now been eliminated, and a Class-AB mode of operation at least at the switchover point 133 is maintained. Thus, it is apparent that numerous advantages may be gained by the circuit of the invention. For example, much better control and predictability of the Class-AB quiescent current can be achieved.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A circuit for providing drive voltages to a voice coil motor (VCM), said circuit having two driver sets, each driver set having a high side driver and a low side driver, each driver set for connection to respective opposite sides of said VCM, each driver set comprising:

first and second SENSEFET devices respectively in said high side driver and said low side driver, each SENSEFET device having a first portion for selectively connecting a side of said VCM to a VCM driving potential and a second portion for sensing a current in said first portion;

a circuit for sensing a sense current in said second portion of said SENSEFET device of said low side driver;

a circuit for increasing a bias on gates of said SENSEFET device in said low side driver when said sense current falls below a predetermined level; and a circuit for driving a predetermined current in said SENSEFET device of said high side driver when said sense current falls below said predetermined level, wherein a current of at least about said predetermined level always flows in said SENSEFET devices.

2. The circuit of claim 1 wherein said first and second portions of said SENSEFET devices are two FET device with interconnected gates and drains.

3. The circuit of claim 2 wherein said two FET device are scaled with a ratio of about 200:1.

4. The circuit of claim 1 wherein said circuit for sensing a current in said second portion of said SENSEFET device of said low side driver comprises:

a resistor between a source of said second portion of said SENSEFET device of said low side driver and a reference potential, wherein said sense current generates a sense voltage across said resistor; and a transconductance amplifier connected to compare said sense voltage to a reference voltage to produce a current when said sense voltage exceeds said reference potential.

5. The circuit of claim 4 wherein said circuit for increasing a bias on a gate of said SENSEFET device in said low side driver when said sensed current falls below a predetermined level comprises an input amplifier to control said SENSEFET device of said low side driver, and wherein said input amplifier has an output controlled by said current produced by said transconductance amplifier.

6. The circuit of claim 1 wherein said circuit for driving a predetermined current in said second portion of said SENSEFET device of said high side driver when said sensed current falls below said predetermined level comprises:

a resistor connected at a first end to said second portion of said SENSEFET device of said high side driver;

a current source connected at a first end to a reference potential; and a transconductance amplifier having first and second inputs, said first input being connected to a second end of said resistor and to a second end of said current source, and said second input being connected to said side of said VCM, said transconductance amplifier producing an output current related to a voltage difference between said first and second inputs to control a gate of said SENSEFET device of said high side driver.

7. The circuit of claim 1 wherein said VCM positions a head for at least reading data in a mass data storage device.

8. A circuit for maintaining a Class-AB mode of operation of an H-bridge voice coil motor (VCM) driver, comprising:

four SENSEFET devices connected in an H-bridge configuration with said VCM;

four gate biasing circuits connected to bias respective gates of said SENSEFET devices to selectively turn said SENSEFET devices on and off in response to positioning signals for said VCM;

sensing circuitry associated with respective said SENSEFET devices to operate said gate biasing circuits to maintain gate biases on said SENSEFET devices when currents in said SENSEFET devices fall below a predetermined level to maintain said circuit in Class-AB mode of operation.

9. The circuit of claim 8 wherein:

each of said gate biasing circuits comprises a fixed current source and a variable current source connected in series between a supply voltage and a reference potential;

interconnecting nodes between respective said fixed and said variable current sources are connected to a gate of a respective one of said SENSEFET devices; and said variable current source is connected to be controlled by said positioning signals.

10. The circuit of claim 8 wherein said VCM positions a head for at least reading data in a mass data storage device.

11. A circuit for providing drive voltages to a voice coil motor (VCM), said circuit having two driver sets, each driver set including a high and a low side driver, each driver set for connection to respective opposite sides of said VCM, each driver set comprising:

first and second SENSEFETs respectively in said high and low side drivers, each SENSEFET having a power FET portion for selectively connecting a side of said VCM to a driving voltage potential and a sense FET portion for sensing a sense current in said power FET portion;

means for developing a sense voltage proportional to said sense current sensed by said sense FET portion of said SENSEFET of said low side driver;

means for increasing a gate bias on gates of said SENSEFET of said low side driver when said sense current falls below a predetermined level; and means for driving a predetermined current in said power FET portion of said SENSEFET of said high side driver when said sense current falls below said predetermined level, wherein at least about said predetermined current flows in said SENSEFETs at least during a switchover from a high side driver to a low side driver in one of said driver sets.

12. The circuit of claim 11 wherein said power FET and said sense FET portions are scaled with a ratio of about 200:1.

13. The circuit of claim 11 wherein said VCM positions a head for at least reading data in a mass data storage device.

14. A method for providing drive voltages to a voice coil motor (VCM), comprising:

configuring four SENSEFET devices in an H-bridge configuration with said VCM to provide two driver sets, each driver set including a high side driver and a low side driver; and biasing said SENSEFET devices to conduct a minimum quiescent current during a switchover between a high side driver and a low side driver in one of said driver sets.

15. The method of claim 14 wherein said biasing said SENSEFET devices to conduct a minimum quiescent current during switchover comprises:

developing sense voltages in said low side drivers proportional to currents sensed by said SENSEFET devices of said low side drivers;

increasing a gate bias on gates of said SENSEFET devices of said low side drivers when currents in said SENSEFET devices fall below a predetermined level; and driving a predetermined current in said SENSEFET devices of said high side drivers when a currents in said SENSEFET devices fall below said predetermined level, wherein at least said predetermined current flows in said SENSEFET devices of said high and low side drivers at least during a switchover from a high side driver to a low side driver in a driver set.

16. A mass data storage device, comprising:
- a circuit for providing drive voltages to a voice coil motor (VCM), said circuit having two driver sets, each having a high and a low side driver, each driver set for connection to respective opposite sides of said VCM, each driver set comprising:
  - first and second SENSEFET devices respectively in said high and low side drivers, each SENSEFET device having a first portion for selectively connecting a side of said VCM to a VCM driving potential and a second portion for sensing a current in said first portion;
  - a circuit for developing a sense voltage proportional to a sense current sensed by said second portion of said SENSEFET device of said low side driver;
  - a circuit for increasing a gate bias on gates of said SENSEFET device of said low side driver when said sense current falls below a predetermined level; and
  - a circuit for driving a predetermined current in said SENSEFET device of said high side driver when said sense current falls below said predetermined level, wherein a current of at least about said predetermined level always flows in said SENSEFET devices.

17. The mass data storage device of claim 16 wherein said first and second portions of said SENSEFET devices are two FET device with interconnected gates and drains.

18. The mass data storage device of claim 17 wherein said two FET devices are scaled with a ratio of about 200:1.

19. The mass data storage device of claim 16 wherein said circuit for sensing a current in said second portion of said SENSEFET device of said low side driver comprises:
- a resistor between a source of said second portion of said SENSEFET device of said low side driver and a reference potential, wherein said sense current in said second portion of said SENSEFET device of said low side driver generates a voltage across said resistor; and
- a transconductance amplifier connected to compare said voltage across said resistor to a reference voltage to produce a current when said voltage across said resistor exceeds said reference potential.

20. The mass data storage device of claim 19 wherein said circuit for increasing a bias on a gate of said SENSEFET device in said low side driver when said sensed current falls below a predetermined level comprises an input amplifier to control said SENSEFET device of said low side driver, and wherein said input amplifier has an output controlled by said current produced by said transconductance amplifier.

21. The mass data storage device of claim 16 wherein said circuit for driving a predetermined current in said second portion of said SENSEFET device of said high side driver when said sensed current falls below said predetermined level comprises:
- a resistor connected at a first end to said second portion of said SENSEFET device of said high side driver;
- a current source connected at a first end to a reference potential; and
- a transconductance amplifier having first and second inputs, said first input being connected to a second end of said resistor and to a second end of said current source, and said second input being connected to said side of said VCM, said transconductance amplifier producing an output current related to a voltage difference between said first and second inputs to control a gate of said SENSEFET device of said high side driver.

22. The mass data storage device of claim 16 wherein said VCM positions a head for at least reading data in a mass data storage device.

* * * * *